US011579192B2

(12) United States Patent
Kidokoro et al.

(10) Patent No.: US 11,579,192 B2
(45) Date of Patent: Feb. 14, 2023

(54) ERROR RATE MEASURING APPARATUS AND ERROR RATE MEASURING METHOD

(71) Applicant: ANRITSU CORPORATION, Kanagawa (JP)

(72) Inventors: Hisao Kidokoro, Kanagawa (JP); Hiroyuki Inaba, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/370,566

(22) Filed: Jul. 8, 2021

(65) Prior Publication Data

US 2022/0074987 A1 Mar. 10, 2022

(30) Foreign Application Priority Data

Sep. 4, 2020 (JP) .............................. JP2020-149186

(51) Int. Cl.
G01R 31/317 (2006.01)
G01R 31/319 (2006.01)
G01R 31/3193 (2006.01)
H04L 1/20 (2006.01)

(52) U.S. Cl.
CPC ... G01R 31/3171 (2013.01); G01R 31/31905 (2013.01); G01R 31/31937 (2013.01); H04L 1/20 (2013.01)

(58) Field of Classification Search
None
See application file for complete search history.

(56) References Cited

U.S. PATENT DOCUMENTS

| 9,137,063 B2* | 9/2015 | Zerbe ................... H04L 7/0337 |
| 2006/0188043 A1* | 8/2006 | Zerbe ................... H04W 52/20 375/233 |
| 2013/0067127 A1* | 3/2013 | Hopgood ............. G06F 13/4282 710/104 |
| 2019/0042380 A1* | 2/2019 | Das Sharma ....... G06F 13/4295 |
| 2019/0042507 A1* | 2/2019 | Venkatesan ............. H04L 25/08 |

FOREIGN PATENT DOCUMENTS

JP 2007-274474 A 10/2007

* cited by examiner

Primary Examiner — Guerrier Merant
(74) Attorney, Agent, or Firm — Pearne & Gordon LLP

(57) ABSTRACT

An error rate measuring apparatus includes a data transmission unit that transmits a test signal of a known pattern and a parameter value defined by a communication standard to a device under test, and a bit error measurement unit that measures a bit error of a signal transmitted from the device under test. The data transmission unit sequentially changes the parameter value and transmits the parameter value to the device under test. The bit error measurement unit measures a bit error of a signal transmitted from the device under test corresponding to the parameter value. The error rate measuring apparatus further includes a discrimination unit that discriminates a parameter value at which the number of bit errors is the least in a measurement result of the bit error measurement unit, as an optimum value of emphasis of an output waveform of the device under test.

8 Claims, 4 Drawing Sheets

| Speed [GT/s] | Detect preset | Error count | Use preset | Preset | Pre-cursor | Cursor | Post-cursor |
|---|---|---|---|---|---|---|---|
| 16 0 | (Measuring apparatus ==> DUT) | 0 | 1 (Preset) | P6 | 3 | 21 | 0 |
| 16 1 | (Measuring apparatus <== DUT) | 1278 | 0 (Cursor) | P6 | 3 | 21 | 0 |
| 16 0 | (Measuring apparatus ==> DUT) | 0 | 1 (Preset) | P7 | 2 | 17 | 5 |
| 16 1 | (Measuring apparatus <== DUT) | 0 | 0 (Cursor) | P7 | 2 | 17 | 5 |
| 16 0 | (Measuring apparatus ==> DUT) | 0 | 1 (Preset) | P8 | 3 | 18 | 3 |
| 16 1 | (Measuring apparatus <== DUT) | 0 | 0 (Cursor) | P8 | 3 | 18 | 3 |
| 16 0 | (Measuring apparatus ==> DUT) | 0 | 1 (Preset) | P9 | 4 | 20 | 0 |
| 16 1 | (Measuring apparatus <== DUT) | 0 | 0 (Cursor) | P9 | 4 | 20 | 0 |
| 16 0 | (Measuring apparatus ==> DUT) | 0 | 1 (Preset) | P10 | 0 | 16 | 8 |
| 16 1 | (Measuring apparatus <== DUT) | 0 | 0 (Cursor) | P10 | 0 | 17 | 7 |
| 16 0 | (Measuring apparatus ==> DUT) | 0 | 1 (Preset) | P0 | 0 | 18 | 6 |
| 16 1 | (Measuring apparatus <== DUT) | 0 | 0 (Cursor) | P0 | 0 | 18 | 6 |
| 16 0 | (Measuring apparatus ==> DUT) | 0 | 1 (Preset) | P1 | 0 | 20 | 4 |
| 16 1 | (Measuring apparatus <== DUT) | 0 | 0 (Cursor) | P1 | 0 | 20 | 4 |
| 16 0 | (Measuring apparatus ==> DUT) | 0 | 1 (Preset) | P2 | 0 | 20 | 5 |
| 16 1 | (Measuring apparatus <== DUT) | 0 | 0 (Cursor) | P2 | 0 | 19 | 5 |
| 16 0 | (Measuring apparatus ==> DUT) | 0 | 1 (Preset) | P3 | 0 | 19 | 3 |
| 16 1 | (Measuring apparatus <== DUT) | 0 | 0 (Cursor) | P3 | 0 | 21 | 3 |
| 16 0 | (Measuring apparatus ==> DUT) | 39342 | 0 (Cursor) | P4 | 0 | 24 | 0 |
| 16 1 | (Measuring apparatus <== DUT) | 0 | 1 (Preset) | P4 | 0 | 24 | 0 |
| 16 0 | (Measuring apparatus ==> DUT) | 34331 | 0 (Cursor) | P5 | 2 | 22 | 0 |
| 16 1 | (Measuring apparatus <== DUT) | 0 | 1 (Preset) | P5 | 2 | 22 | 0 |
| 16 0 | (Measuring apparatus ==> DUT) | 0 | 1 (Preset) | P7 | 2 | 17 | 5 |
| 16 1 | (Measuring apparatus <== DUT) | 0 | 0 (Cursor) | P7 | 2 | 17 | 5 |

FIG. 3

ERROR RATE MEASURING APPARATUS AND ERROR RATE MEASURING METHOD

TECHNICAL FIELD

The present invention relates to an error rate measuring apparatus and an error rate measuring method that transmits a test signal of a known pattern to a device under test (DUT) in a state in which the device under test transits to a state of signal pattern return, and measures a bit error rate (BER) of input data returned and received from the device under test in compliance with the transmission of the test signal.

BACKGROUND ART

For example, as described in Patent Document 1 described below, an error rate measuring apparatus is hitherto known as an apparatus that transmits a test signal of a known pattern including fixed data to a device under test (DUT) in a state in which the device under test transits to a state of signal pattern return, and compares a signal under test returned and received from the device under test in compliance with the transmission of the test signal with a reference signal to be a reference in units of bits to measure a bit error rate.

Incidentally, as one item of a compliance test defined by PCI Express (hereinafter, abbreviated as PCIe) PHY Test Specification that is performed using this kind of error rate measuring apparatus, there is a Link Equalization Test for evaluating the reception performance of the device under test. The test is a test that, during link training, performs bit error measurement using a signal looped back from the device under test after the device under test optimizes the emphasis of an output waveform of the error rate measuring apparatus. A test is conducted about whether or not the device under test can control the output waveform of the error rate measuring apparatus to optimize the output waveform for reception in the device under test. That is, emphasis optimization of the output waveform of the error rate measuring apparatus is executed in a transmission path from the error rate measuring apparatus toward the device under test.

On the other hand, in a transmission path from the device under test toward the error rate measuring apparatus, emphasis optimization of an output waveform of the device under test is not specified. It is considered that this is because the reception performance of the error rate measuring apparatus is generally higher than the reception performance of the device under test, and thus, there is no need for optimization so far.

RELATED ART DOCUMENT

Patent Document

[Patent Document 1] JP-A-2007-274474

DISCLOSURE OF THE INVENTION

Problem that the Invention is to Solve

However, in regard to a high speed signal of newly standardized PCIe Gen5 (32.0 GT/s), even in the error rate measuring apparatus, a waveform subjected to optimum emphasis corresponding to the transmission path is not output from the device under test, and thus, it is difficult to receive a waveform from the device under test to realize an error-free state. Incidentally, it is very difficult to manually perform emphasis adjustment of the output waveform of the device under test. This is because information for accessing an internal setting of the device under test is not disclosed in many cases. As a result, in order to perform emphasis adjustment of the output waveform of the device under test, there is a need to perform emphasis adjustment with link training.

Accordingly, the invention has been accomplished in view of the above-described problem, and an object of the invention is to provide an error rate measuring apparatus and an error rate measuring method capable of obtaining an optimum value for adjusting and controlling emphasis of an output waveform of a device under test during link training.

Means for Solving the Problem

To achieve the above-described object, there is provided an error rate measuring apparatus according to a first aspect of the invention including a data transmission unit (4) that transmits a test signal of a known pattern and a parameter value defined by a communication standard to a device under test (W), and a bit error measurement unit (5a) that measures a bit error of a signal transmitted from the device under test. The data transmission unit sequentially changes the parameter value and transmits the parameter value to the device under test. The bit error measurement unit measures a bit error of a signal transmitted from the device under test corresponding to the parameter value. The error rate measuring apparatus further includes a discrimination unit (5b) that discriminates a parameter value at which the number of bit errors is the least in a measurement result of the bit error measurement unit, as an optimum value of emphasis of an output waveform of the device under test.

According to a second aspect of the invention, in the error rate measuring apparatus according to the first aspect, the communication standard is a PCI Express standard, and the data transmission unit sequentially changes the parameter value by Preset or Cursor within a timeout time of Recovery Equalization Phase during link training for managing a state of a link and transmits the parameter value to the device under test.

According to a third aspect of the invention, in the error rate measuring apparatus according to the second aspect, the data transmission unit transmits the optimum value of the emphasis to the device under test, and the bit error measurement unit measures a bit error of the output waveform of the device under test with the emphasis adjusted and controlled with the optimum value of the emphasis transmitted from the data transmission unit to the device under test in a state in which a link training and status state machine of the device under test transits to a state of loopback.

According to a fourth aspect of the invention, the error rate measuring apparatus of the third aspect further includes a storage unit (6) that stores a state transition log including the measurement result of the bit error measured by the bit error measurement unit.

According to a fifth aspect of the invention, there is provided an error rate measuring method that transmits a test signal of a known pattern and a parameter value defined by a communication standard to a device under test (W), and measures a bit error of a signal transmitted from the device under test. The error rate measuring method includes a step of sequentially changing the parameter value and transmitting the parameter value to the device under test, a step of measuring a bit error of a signal transmitted from the device under test corresponding to the parameter value, and a step of discriminating a parameter value at which the number of bit errors is the least in a measurement result of the bit error, as an optimum value of emphasis of an output waveform of the device under test.

According to a sixth aspect of the invention, in the error rate measuring method according to the fifth aspect, the communication standard is a PCI Express standard, and the step of sequentially changing the parameter value and transmitting the parameter value to the device under test is a step of transmitting the parameter value to the device under test while sequentially changing the parameter value by Preset or Cursor within a timeout time of Recovery Equalization Phase during link training for managing a state of a link and transmitting the parameter value to the device under test.

According to a seventh aspect of the invention, the error rate measuring method according to the sixth aspect further includes a step of transmitting the optimum value of the emphasis to the device under test, and a step of measuring a bit error of the output waveform of the device under test with the emphasis adjusted and controlled with the optimum value of the emphasis transmitted to the device under test in a state in which a link training and status state machine of the device under test transits to a state of loopback.

According to an eighth aspect of the invention, the error rate measuring method according to the seventh aspect further includes a step of storing a state transition log including the measurement result of the bit error.

Advantage of the Invention

According to the invention, it is possible to obtain an optimum value for adjusting and controlling the emphasis of the output waveform of the device under test during link training. Then, it is possible to adjust and control the emphasis of the output waveform of the device under test with the optimum value in a transmission path from the device under test to the error rate measuring apparatus to the optimum value to perform bit error measurement, and to evaluate the reception performance of the device under test.

BRIEF DESCRIPTION OF THE DRAWINGS

FIG. 3 is a diagram showing an example of a state transition log including a bit error measurement result when Preset is incremented by the error rate measuring apparatus according to the invention.

BEST MODE FOR CARRYING OUT THE INVENTION

Hereinafter, a mode for carrying out the invention will be described in detail referring to the accompanying drawings.

Outline of the Invention

Figure 4:
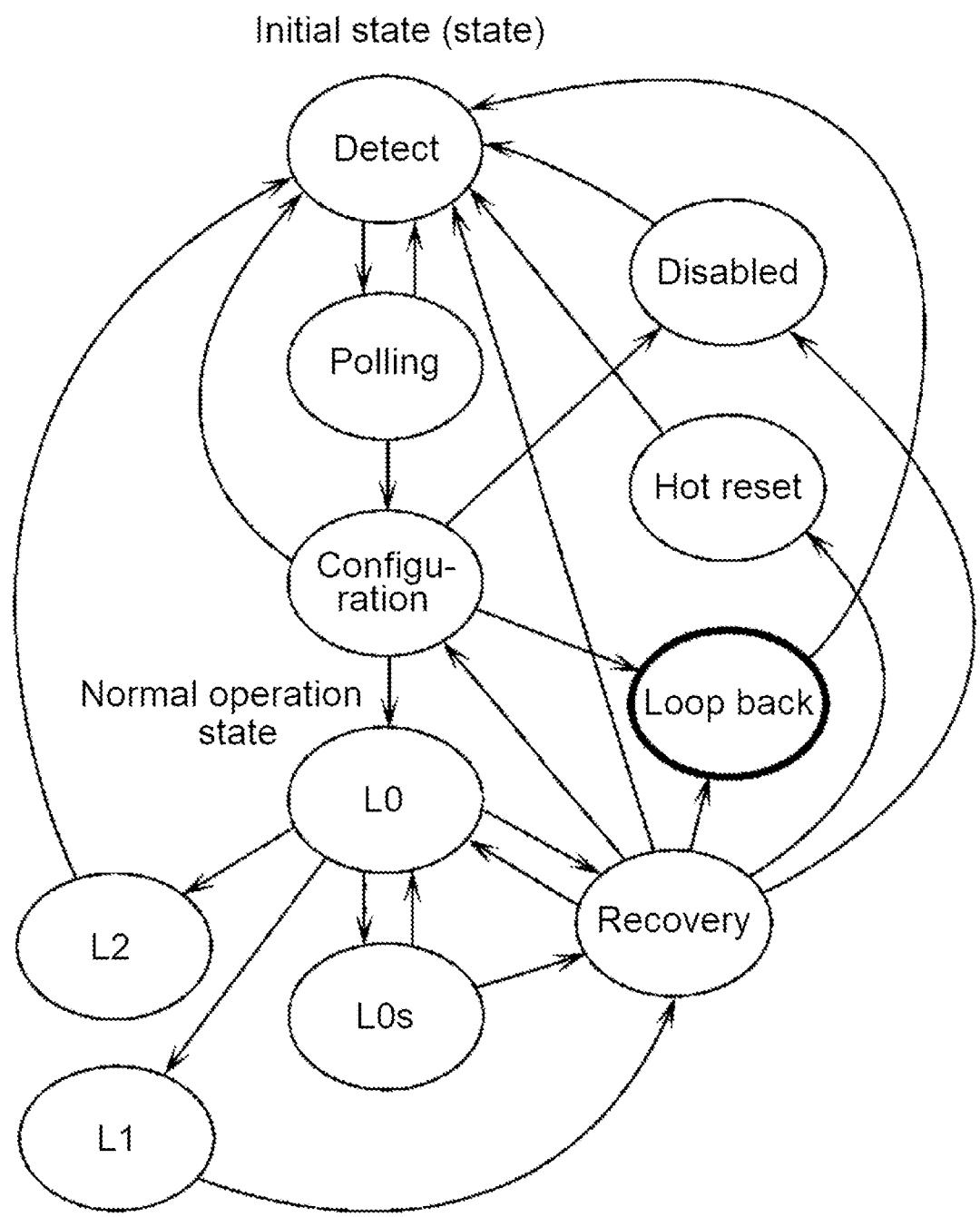
FIG. 4 is a state transition diagram of an LTSSM as an example of a link state management mechanism.

An error rate measuring apparatus according to the invention has a device conforming to, for example, a standard of PCIe that is a connection standard of an expansion bus or an expansion slot, as a device under test (DUT), transmits a test signal of a known pattern including fixed data to the device under test in a state in which the device under test transits to a state of signal pattern return (a "Loopback" state of a link training and status state machine (LTSSM) of FIG. 4), and compares a signal under test returned and received from the device under test in compliance with the transmission of the test signal with a reference signal to be a reference in units of bits and measure a bit error rate.

In particular, an object of the invention is to acquire an optimum value of emphasis of an output waveform of the device under test optimum for reception in the error rate measuring apparatus during link training for managing a state of a link, to adjust and control the emphasis of the output waveform of the device under test with the optimum value, and to perform bit error measurement in a Link Equalization Test (hereinafter, referred to as a reception performance evaluation test).

Figure 1:
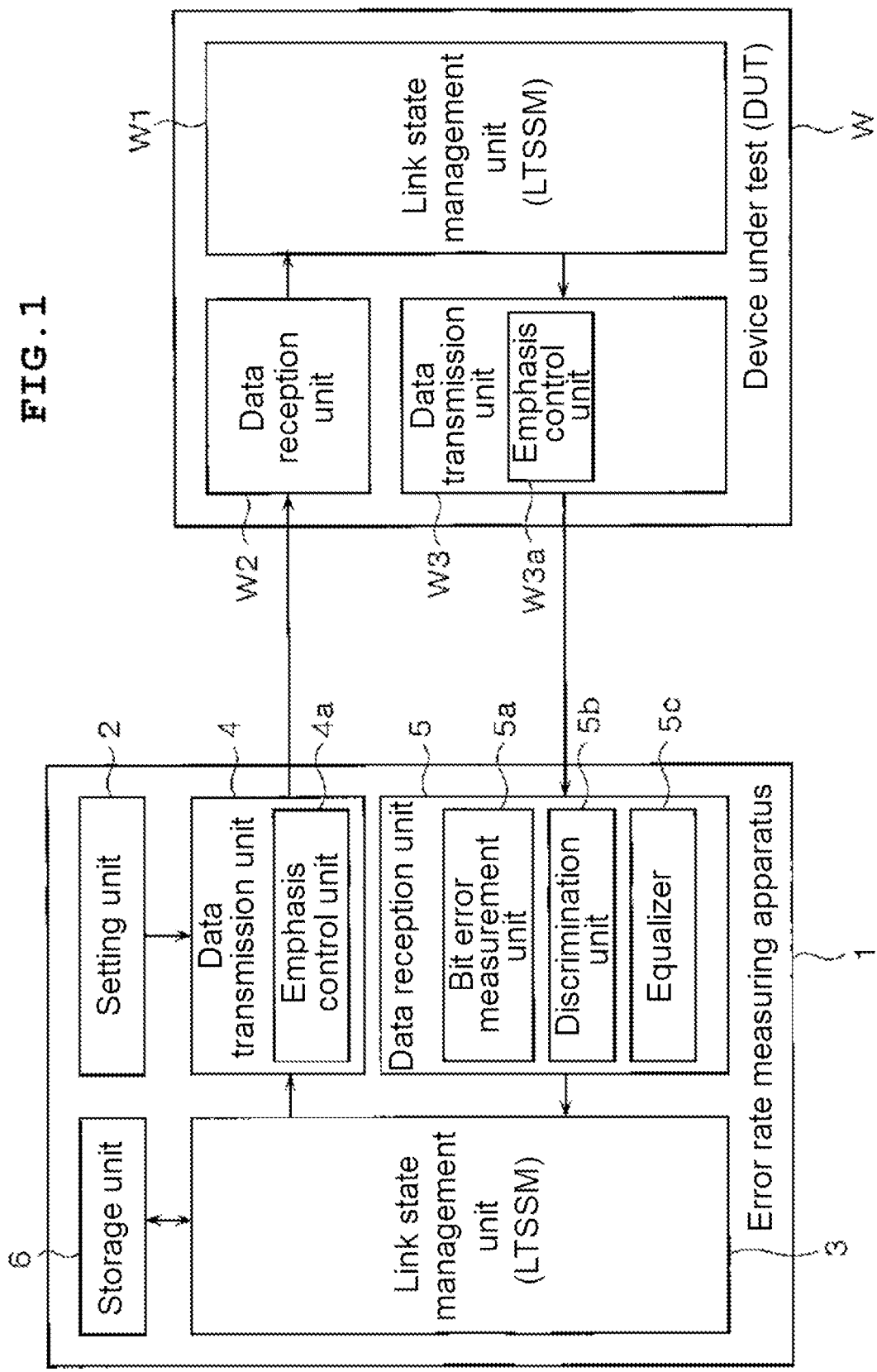
FIG. 1 is a block diagram showing the schematic configuration of an error rate measuring apparatus according to the invention.

As shown in FIG. 1, to achieve the above-described object, an error rate measuring apparatus 1 schematically includes setting unit 2, a link state management unit 3, a data transmission unit 4, a data reception unit 5, and a storage unit 6, and has functions of sequentially changing a parameter value (Preset or Cursor) within a timeout time of Recovery Equalization as one state of a link state management mechanism (LTSSM of FIG. 4) and making a request of change (transmission) to the device under test W to measure a bit error, holding a parameter value at which the number of measured bit errors is the least, as an optimum value of emphasis, requesting the device under test W for the held optimum value, and adjusting and controlling the emphasis of the output waveform of the device under test W with the optimum value to perform bit error measurement in the reception performance evaluation test.

As shown in FIG. 1, the device under test W mounts a link state management unit W1 by the LTSSM of FIG. 4 as a link state management mechanism that manages a link state, and schematically includes a data reception unit W2 and a data transmission unit W3. Hereinafter, each configuration of the device under test W and the error rate measuring apparatus 1 will be described.

Configuration of Device Under Test

The data reception unit W2 receives a change instruction of a parameter value (Preset or Cursor) from the data transmission unit 4 of the error rate measuring apparatus 1 during link training for managing a state of a link in executing the optimization of the emphasis of the output waveform of the device under test W with the reception performance evaluation test.

The optimization of the emphasis means that a parameter value (Preset or Cursor) at which the number of bit errors is the least within a given time (within the timeout time of Recovery Equalization in the reception performance evaluation test) is set as the optimum value and the emphasis of the output waveform of the device under test W is adjusted and controlled with the optimum value.

In performing the bit error measurement, the data reception unit W2 receives a test signal of a known pattern including fixed data from the data transmission unit 4 of the error rate measuring apparatus 1 in a state of transiting to a state (a "Loopback" state of the LTSSM of FIG. 4) of signal pattern return.

The data transmission unit W3 has an emphasis control unit W3a that adjusts and controls the emphasis of the output waveform of the device under test W in compliance with the change instruction of the parameter value received by the data reception unit W2 from the data transmission unit 4 of the error rate measuring apparatus in executing the optimization of the emphasis of the output waveform of the device under test W with the reception performance evaluation test.

In performing the bit error measurement, in a case where the data reception unit W2 receives the test signal of the known pattern from the data transmission unit 4 of the error rate measuring apparatus 1, the data transmission unit W3 returns and transmits a response signal to the received test signal to the error rate measuring apparatus 1 as a signal under test.

Configuration of Error Rate Measuring Apparatus

The setting unit 2 performs various settings regarding the bit error measurement. Specifically, the setting unit 2 performs a setting about whether or not to execute the optimization of the emphasis of the output waveform of the device under test W with the reception performance evaluation test, a selection setting about whether the device under test W is "Upstream Port" (Add-in Card: downstream device) or "Downstream Port" (system device: upstream device), a selection setting of the parameter value: "Preset" (any of Preset 0 to Preset 10) or "Cursor" (designated with three parameters of Pre-cursor, Cursor, and Post-cursor) the request of change (transmission) of which is made to the device under test W, a setting of an upper limit value of the number of executions of the adjustment of the emphasis by the request of change (transmission) of the parameter value determined by the timeout time of Recovery Equalization.

In a case where the optimization of the emphasis is not executed, the setting unit 2 sets "Preset" (any of Preset 0 to Preset 10) or "Cursor" (designated with three parameters of Pre-cursor, Cursor, and Post-cursor) desired by a user.

The link state management unit 3 has an LTSSM as the same or equivalent mechanism as the link state management unit W1 mounted in the device under test W and operates in compliance with a standard (for example, PCIe).

The link state management unit 3 recognizes a current link state of the link state management unit W1 of the device under test W by training patterns (TS1 Ordered Sets and TS2 Ordered Sets) that are communicated with the device under test W (data reception unit W2 and data transmission unit W3). Specifically, various kinds of information, such as a link speed, assert or deassert of loopback, a lane number for identifying a lane, a link number, a generation time or the number of times of generation of a pattern signal, an emphasis amount, and an adjustment value of an equalizer of a recipient, are obtained.

The link state management unit 3 performs, as discrimination based on information set with the setting unit 2, discrimination about whether the device under test W is the Upstream Port or the Downstream Port, discrimination about whether or not to execute the optimization of the emphasis of the output waveform of the device under test W, discrimination about whether the selected and set parameter value is Preset or Cursor, discrimination about whether or not the device under test W supports the parameter value to which the request of change (transmission) is made, discrimination about whether or not the number of executions of the adjustment of the emphasis reaches the upper limit value, and the like.

In communication between the error rate measuring apparatus 1 and the device under test W, the link state management unit 3 manages the current link state of the device under test W by a training pattern received from the data transmission unit W3 of the device under test W in compliance with transmission of a training pattern for recognizing the current link state of the device under test W from the data transmission unit 4 and instructs, to the data transmission unit 4, a training pattern to be next transmitted as a training pattern corresponding to a current training sequence of the device under test W.

In executing the optimization of the emphasis of the output waveform of the device under test W in the reception performance evaluation test, the data transmission unit 4 generates and transmits a training pattern based on a training sequence necessary for recognizing the current link state of the device under test W in the data reception unit 5 in response to an instruction from the link state management unit 3. The training pattern includes data instructing the change of the parameter value (Preset or Cursor) to the device under test W, data regarding information set with the setting unit 2, and the like.

The data transmission unit 4 generates and transmits a training pattern for transiting a link state of the link state management unit W1 of the device under test W to loopback (transiting the LTSSM of the link state management unit W1 of the device under test W to the "Loopback" state of FIG. 4) based on the training sequence by the instruction of the link state management unit 3.

The data transmission unit 4 has an emphasis control unit 4a that adjusts and controls the emphasis of the output waveform of the error rate measuring apparatus 1, and generates and transmits a pattern signal (test signal) by a pseudorandom bit sequence (PRBS) pattern with emphasis of an output waveform adjusted and controlled with the emphasis control unit 4a or any programmable pattern as the known pattern input to the device under test W in performing the bit error measurement of the device under test W in a state in which the device under test W transits to loopback.

The data reception unit 5 includes a bit error measurement unit 5a, a discrimination unit 5b, and an equalizer 5c, and receives data transmitted from the data transmission unit W3 of the device under test W by negotiation between the error rate measuring apparatus 1 and the device under test W.

In executing the optimization of the emphasis of the output waveform of the device under test W in the reception performance evaluation test, the bit error measurement unit 5a measures a bit error of a signal (the output waveform of the device under test W) transmitted from the data transmission unit W3 with emphasis adjusted and controlled with the emphasis control unit W3a of the device under test W based on the request of change (transmission) of the parameter value (Preset or Cursor) to be sequentially changed.

When a request of change (transmission) of the optimum value (the parameter value at which the number of bit errors is the least) of the emphasis stored in the storage unit 6 is made to the device under test W, the bit error measurement unit 5a measures a bit error of a signal (the output waveform of the device under test W with the emphasis adjusted and controlled with the optimum value) transmitted from the data transmission unit W3 with the emphasis adjusted and controlled with the emphasis control unit W3a of the device under test W based on the request of change (transmission).

The discrimination unit 5b sequentially changes the parameter value (Preset or Cursor) within the timeout time of Recovery Equalization and makes the request of change (transmission) to the device under test W to compare an x-th bit error measurement result when the bit error measurement unit 5a measures the bit error (during the execution of the optimization, any number-th execution time in which a bit error measurement result is the least) with a present bit error measurement result, and discriminates a parameter value at which the bit error measurement result is the least, as the optimum value of the emphasis of the output waveform of the device under test W.

The equalizer 5c is configured with, for example, Decision Feedback Equalization (DFE) or Continuous Time Linear Equalizer (CTLE), to achieve improvement of reception sensitivity. The equalizer 5c adjusts a frequency characteristic of the signal transmitted from the data transmission unit W3 with the emphasis of the output waveform adjusted and controlled with the optimum value with the emphasis control unit W3a of the device under test W.

Figure 2:
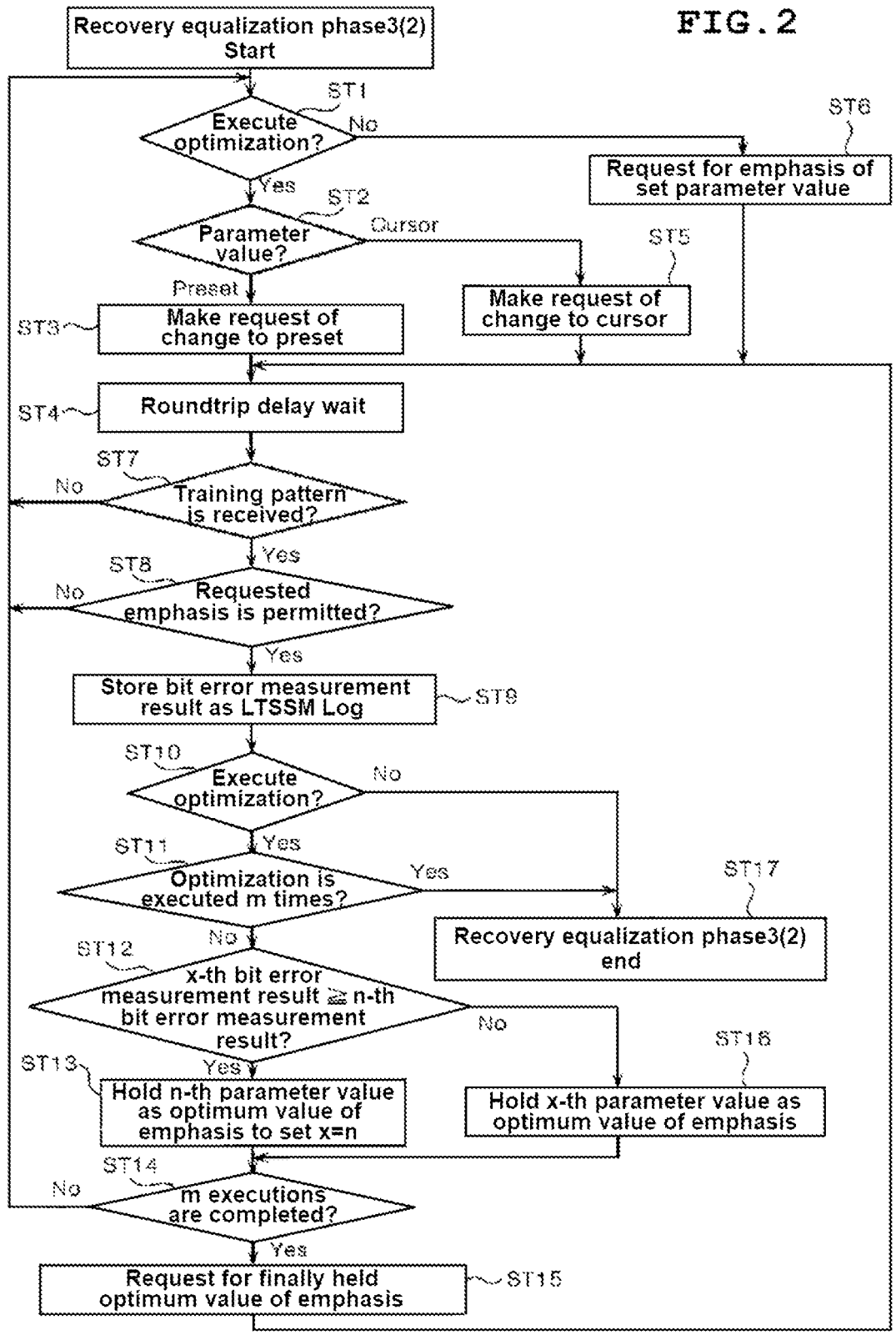
FIG. 2 is a flowchart showing a processing procedure for optimizing emphasis of an output waveform of a device under test by an error rate measuring apparatus according to the invention.

The storage unit 6 stores an LTSSM transition log in a format shown in FIG. 3 including the measurement result of the bit error measured by the bit error measurement unit 5a in compliance with a flowchart of FIG. 2. In this case, the storage unit 6 stores the parameter value discriminated to be the optimum value by the discrimination unit 5b in the measurement result of the bit error, that is, the parameter value (Preset or Cursor) at which the number of bit errors is the least within the timeout time of Recovery Equalization, as the optimum value of the emphasis of the output waveform of the device under test W.

Emphasis Optimization Method of Output Waveform of Device Under Test

Next, a method that adjusts and controls the emphasis of the output waveform of the device under test W to optimize the emphasis of the output waveform of the device under test W by the above-described error rate measuring apparatus 1 will be described referring to the flowchart of FIG. 2.

FIG. 2 is a flowchart for adjusting and controlling emphasis of an output waveform of a device under test in Recovery Equalization Phase 2 or 3 to optimizing the emphasis of the output waveform of the device under test.

Recovery Equalization Phase 2 is a state in which the Upstream Port adjusts emphasis of an output waveform of the Downstream Port. Accordingly, in a case where the device under test W is "Downstream Port", the error rate measuring apparatus 1 adjusts the emphasis of the output waveform of the device under test W in Recovery Equalization Phase 2.

Recovery Equalization Phase 3 is a state in which the Downstream Port adjusts emphasis of an output waveform of the Upstream Port. Accordingly, in a case where the device under test W is "Upstream Port", the error rate measuring apparatus 1 adjusts the emphasis of the output waveform of the device under test in Recovery Equalization Phase 3.

In FIG. 2, "m" is the upper limit value of the number of executions of the adjustment of the emphasis by the request of change (transmission) of the parameter value determined by the timeout time, and "n" is the number of executions of the adjustment (n=1, 2, 3, . . . ). When n=1, Yes is selected.

Link training of PCIe is managed by the LTSSM, and in the reception performance evaluation test, the LTSSM of the device under test W transits to the "Loopback" state of FIG. 4 by performing negotiation between the link state management unit 3 (LTSSM) of the error rate measuring apparatus 1 and the link state management unit W1 (LTSSM) of the device under test W, and bit error measurement is performed. In the embodiment, the adjustment and control of the emphasis of the output waveform of the device under test W are performed by passing through Recovery Equalization in a "Recovery" state of FIG. 4 before the transition to the "Loopback" state.

Accordingly, first, the LTSSM (link state management unit 3, W1) transits to Recovery Equalization Phase 2 or 3 in the Recovery state depending on whether the device under test W is "Upstream Port" or "Downstream Port" by negotiation between the error rate measuring apparatus 1 and the device under test W. That is, in a case where the device under test W is "Downstream Port", transition is made to a state of Recovery Equalization Phase 2, and in a case where the device under test W is "Upstream Port", transition is made to a state of Recovery Equalization Phase 3.

Then, discrimination is made whether or not to execute the optimization of the emphasis in the state of Recovery Equalization Phase 2 or 3 during link training (ST1). Then, in a case where discrimination is made to execute the optimization of the emphasis (ST1—Yes), discrimination is made which of "Preset" (any of Preset 0 to Preset 10) or "Cursor" (Cursor corresponding to any of Preset 0 to Preset 10) is selected and set as a parameter value for adjusting and controlling the emphasis (ST2).

Here, in a case where discrimination is made that "Preset" is selected as the parameter value for adjusting and controlling the emphasis, a request of change (transmission) to the selected and set Preset is made to the device under test W (ST3), and transition is made to a Roundtrip delay wait state (ST4). For example, in a case where "Preset" is selected as the parameter value for adjusting and controlling the emphasis, and "Preset 6" is set as an initial value, a request of change (transmission) to "Preset 6" is made to the device under test W.

The Roundtrip delay is a time until the error rate measuring apparatus 1 makes the request of change (transmission) of the parameter value to the device under test W, and there is a response to the request of change (transmission) from the device under test W to the error rate measuring apparatus 1.

In contrast, in a case where discrimination is made that "Cursor" is selected as the parameter value for adjusting and controlling the emphasis, a request of change (transmission) to the selected and set Cursor is made (ST5), and transition is made to the Roundtrip delay wait state of ST4. For example, in a case where "Cursor" is selected as the parameter value for adjusting and controlling the emphasis in three taps, and a Cursor value of each tap of Pre (Pre-cursor), main (Cursor), and post (Post-cursor) corresponding to "Preset 3" is set, a request of change (transmission) to the Cursor value corresponding to "Preset 3" is made to the device under test W.

In a case where discrimination is made not to execute the optimization of the emphasis (ST1—No), a request of emphasis of a parameter value optionally set by the user is made to the device under test W (ST6), and transition is made to the Roundtrip delay wait state of ST4.

Then, in a case where the Roundtrip delay of ST4 elapses, discrimination is made whether or not a training pattern is received from the device under test W (ST7). In a case where discrimination is made that the training pattern is received from the device under test W (ST7—Yes), discrimination is made whether or not to permit the requested emphasis (ST8). Discrimination about whether or not to permit the requested emphasis is performed depending on whether or not the device under test W supports the parameter value to which the request of change (transmission) is made by the error rate measuring apparatus 1. Then, in a case where discrimination is made to permit the requested emphasis (ST8—Yes), a bit error is measured, and a result of measurement is stored as a state transition log (LTSSM transition log) in the storage unit 6 (ST9).

Thereafter, discrimination is made whether or not to execute the optimization of the emphasis (ST10), and in a case where discrimination is made to execute the optimization of the emphasis (ST10—Yes), discrimination is made whether or not the optimization is executed m times (upper limit number of times) (ST11). In a case where discrimination is made that the optimization is not executed m times (ST11—No), discrimination is made whether or not an x-th (during the execution of the optimization, any number-th execution time in which the bit error measurement result is the least) bit error measurement result is equal to or greater than an n-th (present) bit error measurement result (ST12).

Then, in a case where discrimination is made that the x-th bit error measurement result is equal to or greater than the n-th (present) bit error measurement result (ST12—Yes), a parameter value based on the n-th (present) bit error measurement result is stored as the optimum value of the emphasis in the storage unit 6 and x=n is set (ST13), and discrimination is made whether or not the m (upper limit number of times) executions of the optimization are completed (ST14).

Then, in a case where discrimination is made that the m (upper limit number of times) executions of the optimization are completed (ST14—Yes), the optimum value of the emphasis finally stored in the storage unit 6 (the parameter value at which the number of bit errors is the least within the timeout time of Recovery Equalization) is requested to the device under test W (ST15), and transition is made to the Roundtrip delay wait state of ST4.

In contrast, in a case where discrimination is made that the x-th bit error measurement result is not equal to or greater than the n-th (present) bit error measurement result (ST12—No), a parameter value based on the x-th bit error measurement result is stored as the optimum value of the emphasis in the storage unit 6 (ST16), and discrimination is made whether or not the m (upper limit number of times) executions of the optimization are completed (ST14).

When discrimination is made not to execute the optimization of the emphasis (ST10—No) or when discrimination is made that the optimization is executed m times (upper limit number of times) (ST11—Yes), Recovery Equalization Phase 3(2) ends (ST17).

When discrimination is made that the training pattern is not received from the device under test W (ST7—No), when discrimination is made not to permit the requested emphasis (ST8—No), or when discrimination is made that the m (upper limit number of times) executions of the optimization are not completed (ST14—No), the process returns to ST1.

In this way, the operation based on the flowchart of FIG. 2 is repeated within the timeout time of Recovery Equalization Phase to perform the bit error measurement, and the optimum value of the emphasis is obtained from the measurement result of the bit error.

The bit error measurement is performed using Training Ordered Sets 1 (TS1 Ordered Sets) used for training. The transition log (a transition destination, a generation time, a trigger of transition, and error information per transition of the LTSSM are stored in a memory such that a lapse of time of LTSSM transition can be traced) of the LTSSM including the number of bit errors per adjustment is stored in the storage unit 6 such that the transition log can be confirmed after training is completed.

Here, FIG. 3 shows an example of the state transition log including bit error measurement results when "Preset 6" as the parameter value is set as the initial value by the error rate measuring apparatus 1, and "Preset" is incremented to Preset 6→Preset 7→Preset 8→Preset 9→Preset 10→Preset 0→Preset 1→Preset 2→ . . . →Preset 5 within the timeout time of Recovery Equalization Phase. In the state transition log of FIG. 3, a bit error when "Preset" is selected as the parameter value and is incremented with Preset 6 as the initial value to make a request of change (transmission) to the device under test W is measured, and a parameter value: "Preset 7" (P7) (a portion A surrounded by a dotted line of FIG. 3) at which the error-free state (Error Count "00") is detected first remains as a result (a portion B surrounded by a dotted line of FIG. 3) of the optimum value of the emphasis in the last row of the state transition log.

In this way, according to the embodiment, it is possible to obtain the parameter value at which the number of bit errors of the signal received in the error rate measuring apparatus during link training for managing the state of the link is the least, as the optimum value for adjusting and controlling the emphasis of the output waveform of the device under test. Then, it is possible to adjust and control the emphasis of the output waveform of the device under test with the optimum value in the transmission path from the device under test toward the error rate measuring apparatus to perform the bit error measurement in the reception performance evaluation test, and to evaluate the reception performance of the device under test based on the measurement result.

Although the best mode of the error rate measuring apparatus and the error rate measuring method according to the invention has been described above, the invention is not limited by the description and the drawings according to this mode. That is, it is a matter of course that other modes, examples, operation techniques and the like made by those skilled in the art based on this mode are all included in the scope of the present invention.

DESCRIPTION OF REFERENCE NUMERALS AND SIGNS 1 error rate measuring apparatus
2 setting unit
3 link state management unit (LTSSM)
4 data transmission unit
4a emphasis control unit
5 data reception unit
5a bit error measurement unit
5b discrimination unit
5c equalizer
6 storage unit
W device under test
W1 link state management unit (LTSSM)
W2 data reception unit
W3 data transmission unit
W3a emphasis control unit

What is claimed is:
1. An error rate measuring apparatus comprising:
a data transmission unit that transmits a test signal of a known pattern and a parameter value defined by a communication standard to a device under test; and
a bit error measurement unit that measures a bit error of a signal transmitted from the device under test,
wherein the data transmission unit sequentially changes the parameter value for predetermined times and transmits the parameter value to the device under test,
the bit error measurement unit measures a bit error of a signal transmitted from the device under test corresponding to the parameter value, and
the error rate measuring apparatus further comprises
a discrimination unit that discriminates a parameter value at which a number of bit errors is the least in measurement results of the bit error measurement unit after sequentially changing the parameter value for the predetermined times, as an optimum value of emphasis of an output waveform of the device under test.

2. The error rate measuring apparatus according to claim 1,
wherein the communication standard is a PCI Express standard, and the data transmission unit sequentially changes the parameter value for the predetermined times by Preset or Cursor within a timeout time of Recovery Equalization Phase during link training for managing a state of a link and transmits the parameter value to the device under test.

3. The error rate measuring apparatus according to claim 2,
wherein the data transmission unit transmits the optimum value of the emphasis to the device under test, and
the bit error measurement unit measures a bit error of the output waveform of the device under test with the emphasis adjusted and controlled with the optimum value of the emphasis transmitted from the data transmission unit to the device under test in a state in which a link training and status state machine of the device under test transits to a state of loopback.

4. The error rate measuring apparatus according to claim 3, further comprising:
a storage unit that stores a state transition log including the measurement results of the bit error measured by the bit error measurement unit.

5. An error rate measuring method that transmits a test signal of a known pattern and a parameter value defined by a communication standard to a device under test, and measures a bit error of a signal transmitted from the device under test, the error rate measuring method comprising:
sequentially changing the parameter value for predetermined times and transmitting the parameter value to the device under test;
measuring a bit error of a signal transmitted from the device under test corresponding to the parameter value; and
discriminating a parameter value at which a number of bit errors is the least in measurement results of the bit error after sequentially changing the parameter value for the predetermined times, as an optimum value of emphasis of an output waveform of the device under test.

6. The error rate measuring method according to claim 5,
wherein the communication standard is a PCI Express standard, and the sequentially changing of the parameter value for the predetermined times and transmitting the parameter value to the device under test is sequentially changing the parameter value by Preset or Cursor within a timeout time of Recovery Equalization Phase during link training for managing a state of a link and transmitting the parameter value to the device under test.

7. The error rate measuring method according to claim 6, further comprising:
transmitting the optimum value of the emphasis to the device under test; and
measuring a bit error of the output waveform of the device under test with the emphasis adjusted and controlled with the optimum value of the emphasis transmitted to the device under test in a state in which a link training and status state machine of the device under test transits to a state of loopback.

8. The error rate measuring method according to claim 7, further comprising:
storing a state transition log including the measurement results of the bit error.

* * * * *